(12) United States Patent
Rennig et al.

(10) Patent No.: US 12,088,429 B2
(45) Date of Patent: Sep. 10, 2024

(54) MICROCONTROLLER CIRCUIT, CORRESPONDING DEVICE, SYSTEM AND METHOD OF OPERATION

(71) Applicants: STMicroelectronics Design and Application S.R.O., Prague (CZ); STMicroelectronics Application GMBH, Aschheim-Dornach (DE)

(72) Inventors: Fred Rennig, Nandlstadt (DE); Vaclav Dvorak, Mratín (CZ)

(73) Assignees: STMicroelectronics Design and Application S.R.O., Prague (CZ); STMicroelectronics Application GmbH, Aschheim-Dornach (DE)

( * ) Notice: Subject to any disclaimer, the term of this patent is extended or adjusted under 35 U.S.C. 154(b) by 197 days.

(21) Appl. No.: 17/677,113

(22) Filed: Feb. 22, 2022

(65) Prior Publication Data
US 2022/0286319 A1 Sep. 8, 2022

(30) Foreign Application Priority Data
Mar. 8, 2021 (IT) .......................... 102021000005354

(51) Int. Cl.
*H04L 12/403* (2006.01)
*H03K 7/08* (2006.01)
*H04L 12/40* (2006.01)

(52) U.S. Cl.
CPC ............. *H04L 12/403* (2013.01); *H03K 7/08* (2013.01); *H04L 12/40006* (2013.01); *H04L 2012/40215* (2013.01)

(58) Field of Classification Search
CPC ..... H03K 7/08; H04L 12/40; H04L 12/40006; H04L 12/403; H04L 2012/40215; H04L 2012/40273; B60R 16/023
See application file for complete search history.

(56) References Cited

U.S. PATENT DOCUMENTS

| 5,509,122 A | 4/1996 | Bartow et al. |
| 6,240,478 B1 | 5/2001 | Brickell |

(Continued)

FOREIGN PATENT DOCUMENTS

| CN | 209642692 U | 11/2019 |
| EP | 1158718 A2 | 11/2001 |

(Continued)

OTHER PUBLICATIONS

Stmicroelectronics, Application Note AN4776 Rev 3, "General-purpose timer cookbook for STM32 microcontrollers", Jul. 2019, 72 pages.

(Continued)

*Primary Examiner* — David B Lugo
(74) *Attorney, Agent, or Firm* — Slater Matsil, LLP

(57) ABSTRACT

A circuit includes a first and a second memory, a processor and a timer. The processor generates a sequence of bits encoding a CAN frame and processes the sequence of bits to detect a sequence of PWM periods. The processor stores values of a first parameter of the PWM periods into the first memory, and values of a second parameter of the PWM periods into the second memory. The timer comprises a first register which reads from the first memory a value of the first parameter of a current PWM period. The timer comprises a counter which increases a count number and resets the count number as a function of the value of the first register.

20 Claims, 4 Drawing Sheets

(56) References Cited

U.S. PATENT DOCUMENTS

| | | |
|---|---|---|
| 6,467,065 B1 | 10/2002 | Mendez et al. |
| 10,250,376 B2 | 4/2019 | Hooper et al. |
| 10,313,152 B2 | 6/2019 | Kishigami et al. |
| 10,678,726 B2 | 6/2020 | Rennig et al. |
| 11,366,778 B2 | 6/2022 | Rennig et al. |
| 11,675,721 B2 | 6/2023 | Rennig et al. |
| 2004/0047298 A1 | 3/2004 | Yook et al. |
| 2007/0230559 A1 | 10/2007 | Kris et al. |
| 2007/0294443 A1 | 12/2007 | Berenbaum et al. |
| 2009/0021955 A1 | 1/2009 | Kuang et al. |
| 2009/0157929 A1 | 6/2009 | Pigott et al. |
| 2010/0306431 A1 | 12/2010 | Adkins et al. |
| 2011/0289237 A1 | 11/2011 | Zhang |
| 2012/0083902 A1 | 4/2012 | Daum et al. |
| 2012/0233341 A1 | 9/2012 | Mach |
| 2012/0271924 A1 | 10/2012 | Spitaels et al. |
| 2013/0015798 A1 | 1/2013 | Wright |
| 2013/0057339 A1 | 3/2013 | Koudar |
| 2013/0076417 A1 | 3/2013 | Kris |
| 2014/0025854 A1 | 1/2014 | Breuninger |
| 2014/0156887 A1 | 6/2014 | Hartwich |
| 2015/0192983 A1 | 7/2015 | Rennig |
| 2016/0191629 A1 | 6/2016 | Ryu |
| 2016/0234038 A1 | 8/2016 | Mounier et al. |
| 2017/0070366 A1 | 3/2017 | Hehemann et al. |
| 2017/0155225 A1 | 6/2017 | Villeneaue et al. |
| 2018/0013578 A1 | 1/2018 | Gozloo et al. |
| 2018/0152286 A1 | 5/2018 | Kemparaj et al. |
| 2018/0159698 A1 | 6/2018 | Kim |
| 2019/0001904 A1 | 1/2019 | Sugimoto |
| 2019/0294572 A1 | 9/2019 | Rennig et al. |
| 2020/0050575 A1* | 2/2020 | Mishra ................ G06F 13/4282 |
| 2021/0044448 A1 | 2/2021 | Wetterau et al. |
| 2021/0271924 A1 | 9/2021 | Tarumi et al. |
| 2023/0327907 A1* | 10/2023 | Natori ..................... H04L 12/46 710/305 |

FOREIGN PATENT DOCUMENTS

| | | |
|---|---|---|
| EP | 3460968 A1 | 3/2019 |
| EP | 3541031 A1 | 9/2019 |
| EP | 3547620 A1 | 10/2019 |
| JP | H0364210 A | 3/1991 |
| JP | 2004280304 A | 3/2003 |
| JP | 2009177804 A | 8/2009 |
| JP | 2013243758 A | 12/2013 |
| KR | 101990470 B1 | 6/2019 |
| WO | 2013052886 A2 | 4/2013 |

OTHER PUBLICATIONS

Stmicroelectronics, Application Note AN4013 Rev 8, "STM32 cross-series timer overview", Sep. 2019, 4 pages.

Autosar, "E2E Protocol Specification", Autosar Fo R19-11, ID No. 849, Nov. 28, 2019, 185 pages.

Barthel, Jochen et al., "CAN FD Light—A novel communication bus supporting digitalization and customization of automotive lighting for the broad market," 5 pages, Dated Jul. 2-4, 2019.

Bosch, "Can with Flexible Data-Rate", Specification Version 1.0, Apr. 17, 2012, 34 pages.

Microchip, "CAN FD Controller Module," MCP25xxFD Family Reference Manual, DS20005678B; Revision A; Microchip technology Inc.; Sep. 2017. (Year: 2017), 80 pages.

Microchip, "MCP2517FD External Can Fd Controller with SPI Interface," Data Sheet DS20005688B; Revision A; Microchip Technology Inc.; Aug. 2017. (Year: 2017), 102 pages.

STM32WB, SPI presentation accessed on the internet URL https://www.st.com/resource/en/product_training/ STM32WB-Peripheral-Serial-Peripheral-interface-SPI.pdf; STMicroelectronics; Oct. 6, 2016. (Year: 2016), 29 pages.

STMicroelectronics, EMEA APG Marketing & Application "CAN FD Light Master—SW Emulation Solution," Jun. 24, 2020, Rev 0.1, 6 pages.

STMicroelectronics, EMEA APG Marketing & Application "CAN FD Light Master—SW Emulation Solution," Oct. 14, 2020, Rev 0.2, 9 pages.

STMicroelectronics, EMEA APG Marketing & Application "CAN FD Light Master Implementation Requirements CAN FD Light Master in small μCs," Jun. 3, 2020, Rev 1.0, 7 pages.

STMicroelectronics, EMEA APG Marketing & Application "CAN FD Light Master Emulation by SW," May 25, 2020, Rev 0.1, 6 pages.

STMicroelectronics, EMEA APG Marketing & Application "CAN FD Light Master SW Emulation Solution," Nov. 26, 2020, Rev 0.4, 22 pages.

* cited by examiner

MICROCONTROLLER CIRCUIT, CORRESPONDING DEVICE, SYSTEM AND METHOD OF OPERATION

CROSS-REFERENCE TO RELATED APPLICATIONS

This application claims priority to Italian Patent Application No. 102021000005354, filed on Mar. 8, 2021, which application is hereby incorporated by reference herein in its entirety.

TECHNICAL FIELD

The present disclosure generally relates to circuit communications and, in particular embodiments, to circuit communication for use in automotive applications.

BACKGROUND

Various applications in the automotive field involve the exchange of data via a bus network. High data rate, robustness, fault detection, safety, and low cost are desirable features for such bus networks.

Existing high data rate (e.g., 1 Mb/s) standardized vehicle communication systems may involve complex and accurate protocol controllers (e.g., using external components). These may turn out to be expensive, especially when implemented as a single-chip analog/bipolar Application-Specific Integrated Circuit (ASIC) or Application-Specific Standard Products (ASSP).

Vehicle lights (e.g., front, rear, and interior lights) are becoming increasingly sophisticated and distributed (e.g., Matrix LED, ambient LED). Controlling such sophisticated and distributed lighting systems may rely on high data rate bus systems. Moreover, automotive-grade safety and robustness are desirable, especially for front and rear lighting systems.

Therefore, solutions are known in the art which may rely on the use of a Controller Area Network (CAN) bus, according to a CAN flexible data-rate (FD) protocol or a "customized" CAN FD protocol, for managing the communication between one or more ECUs and one or more peripheral or satellite devices (e.g., driver circuits for lighting modules) according to a master-slave communication scheme.

Documents EP 3547620 A1 and US 2019/0294572 A1 exemplify such known solutions and disclose a master-slave communication protocol referred to as "CAN FD Light," based on the CAN FD standard.

According to such a known solution, a microcontroller equipped with a standard CAN FD peripheral (e.g., the MCAN) can be used at the master side. The slave devices equipped with a CAN FD Light interface can be controlled via a standard CAN high-speed (HS) physical layer using the CAN FD protocol.

It is noted that many automotive microcontrollers currently used in the automotive industry may lack a CAN FD peripheral. Therefore, there is a need in the art to adapt low-cost microcontrollers, which may not be provided with a dedicated CAN FD peripheral, to control slave devices via their common peripherals according to a CAN FD Light communication protocol.

SUMMARY

An object of one or more embodiments is to contribute to providing such automotive microcontrollers adapted to control slave devices according to a CAN FD Light communication protocol without resorting to a dedicated CAN FD peripheral in the microcontroller itself.

According to one or more embodiments, such an object can be achieved using a circuit (e.g., a microcontroller unit) with the features disclosed in the following, which in embodiments, are an integral part of the technical teaching provided herein.

One or more embodiments may relate to a corresponding device (e.g., an electronic control unit used as a master device in a bus communication system for a vehicle). One or more embodiments may relate to a corresponding bus communication system. One or more embodiments may relate to a corresponding method of operation of the circuit, device, or system.

One or more embodiments may be applied to communication between an electronic control unit (ECU) of a vehicle and one or more actuator devices or sensor devices of the vehicle. Driver circuits for LED lighting modules (e.g., front, rear, interior lights) are exemplary of such devices.

According to one or more embodiments, a circuit may include a first memory bank, a second memory bank, a processor, and a timer circuit. The processor may be configured to: i) generate an output sequence of binary values encoding an outgoing CAN frame according to a CAN protocol (e.g., a CAN FD protocol), ii) process the output sequence of binary values to detect a sequence of ordered pulse-width modulated (PWM) periods, where each PWM period includes a first portion having a dominant state or value (e.g., zero) and a second portion having a recessive state or value (e.g., one), and where each PWM period has a respective total duration and a respective duty-cycle value, iii) store into the first memory bank a set of ordered first values indicative of a first parameter (e.g., the total durations) of the PWM periods in the sequence of ordered PWM periods, and iv) store into the second memory bank a set of ordered second values indicative of a second parameter (e.g., the durations of the first portions) of the PWM periods in the sequence of ordered PWM periods.

In one or more embodiments, the timer circuit may include: a first register configured to read from the first memory bank and store therein a value indicative of the first parameter of a current PWM period in the sequence of ordered PWM periods, a counter circuit configured to increase an internal count number and to reset the internal count number as a function of the value stored in the first register, and configured to trigger reading from the first memory bank and storing into the first register a subsequent value indicative of the first parameter of a subsequent PWM period in the sequence of ordered PWM periods as a function of the value stored in the first register, and a second register configured to read from the second memory bank and store therein a value indicative of the second parameter of the current PWM period and compare the internal count number of the counter circuit to the value stored into the second register.

The second register may drive an output pin of the circuit to a dominant value or a recessive value as a function of the comparison of the internal count number of the counter circuit to the value stored in the second register.

The second register may read from the second memory bank and store a subsequent value indicative of the second parameter of a subsequent PWM period in the sequence of ordered PWM periods in response to the internal count number of the counter circuit reaching the value stored into the second register, or in response to the internal count number of the counter circuit reaching the value stored into the first register.

Therefore, one or more embodiments may provide a circuit such as an automotive microcontroller which may be configured to transmit frames according to a CAN protocol, in particular, a CAN FD protocol, without resorting to a dedicated CAN FD peripheral.

BRIEF DESCRIPTION OF THE DRAWINGS

Other advantages and features of the disclosure will become apparent upon examining the detailed description of implementations and embodiments, which are in no way limiting, and of the appended drawings wherein.

DETAILED DESCRIPTION OF ILLUSTRATIVE EMBODIMENTS

Figure 1:
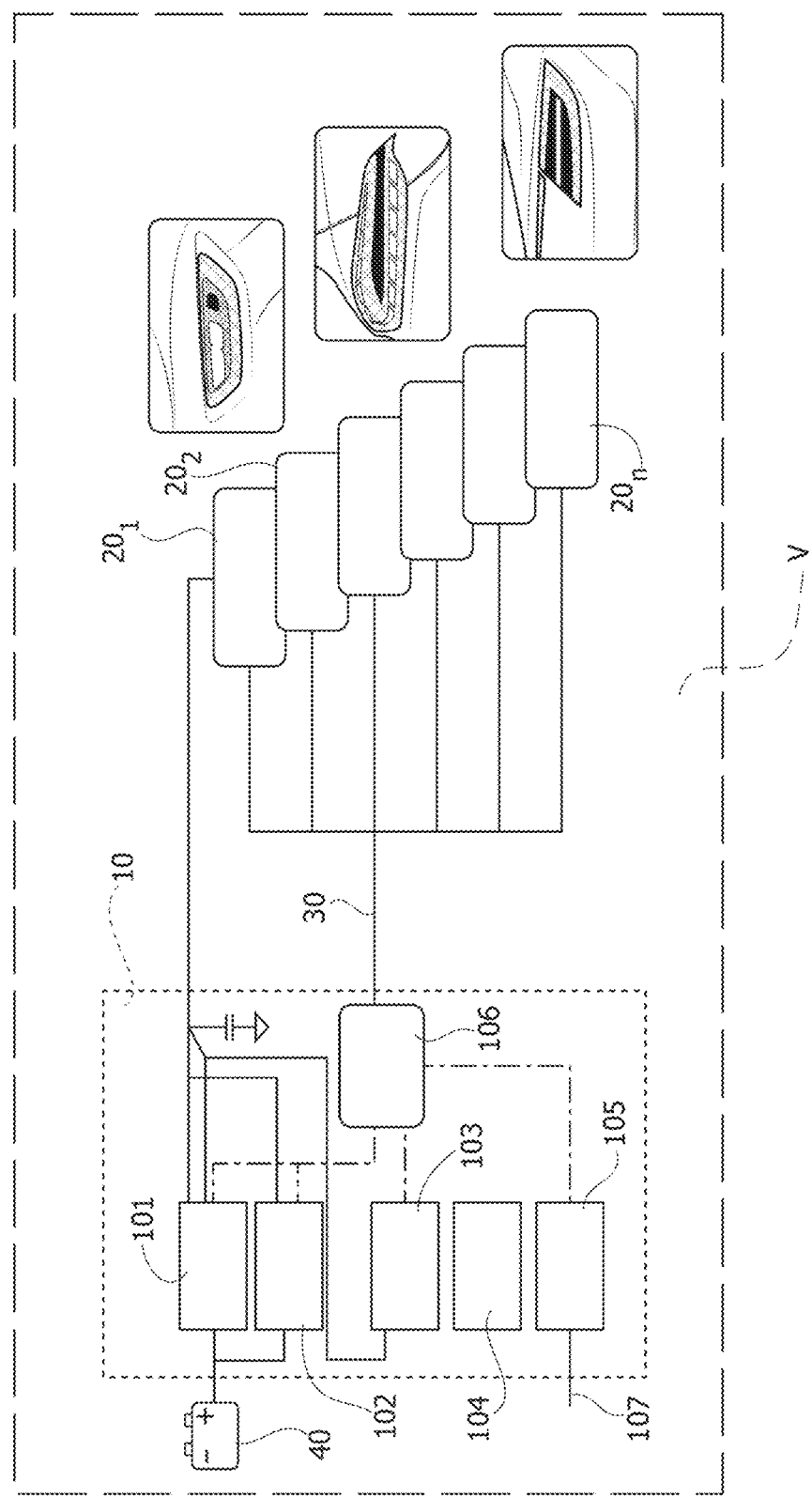
FIG. 1 is a block diagram of an embodiment bus communication system.

This disclosure provides many applicable inventive concepts that can be embodied in a wide variety of specific contexts. The particular embodiments are merely illustrative of specific configurations and do not limit the scope of the claimed embodiments. Features from different embodiments may be combined to form further embodiments unless noted otherwise.

Variations or modifications described to one of the embodiments may also apply to other embodiments. Further, it should be understood that various changes, substitutions, and alterations can be made herein without departing from the spirit and scope of this disclosure as defined by the appended claims.

In the ensuing description, one or more specific details are illustrated, aimed at providing an in-depth understanding of examples of embodiments of this description. The embodiments may be obtained without one or more of the specific details or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is included in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

Throughout the figures annexed herein, unless the context indicates otherwise, like parts or elements are indicated with like references/numerals and a corresponding description will not be repeated for brevity.

The headings/references used herein are provided merely for convenience and hence do not define the extent of protection or the scope of the embodiments.

The increasing computation power of automotive microcontrollers and the development of high data rate networks may provide data processing and device control combined in single electronic control units (ECU).

It is noted that such electronic control units configured to perform data processing and device control may be located close to the area where actuators and sensors are placed in the vehicle (e.g., to implement so-called "zone controllers"). Such zone controllers may be placed in various areas (zones) of a vehicle and may be connected to one or more central ECUs by a high bandwidth network (e.g., an Ethernet network). The zone controllers may collect sensor data and drive actuators (e.g., with a high time resolution). Processing of data collected from the sensors or addressed to the actuators can therefore be performed in the zone controllers, without the need of providing dedicated processing circuits arranged locally on the same circuit board(s) which hosts the sensor(s) or the actuator(s). The network connection between the actuators or sensors on one side and the (zone) controllers on the other side is not restricted to a dedicated component but can be routed through the vehicle. Therefore, a robust, reliable, and trusted network may be desirable.

An exemplary application in which the "zone controller architecture" may be implemented relates to controlling a vehicle's lights (e.g., to implement an animated rear light). In addition to the conventional functions such as turn indicator, brake indicator, and tail light, such an application may provide additional features such as the ability to inform and warn the traffic behind the vehicle and animations for design and branding. Such functions or animations may be realized by controlling tens or hundreds of individual light sources (e.g., LED light sources), which may be dynamically activated with a high resolution of individual intensity. Additionally, diagnosis data may be obtained cyclically from the LED drivers to provide short reaction times on failures.

The above-exemplified application may rely, for instance, on the adaptation of a CAN protocol (e.g., a CAN FD protocol) to support one or more additional functions.

For instance, a CAN protocol may be adapted to a master-slave communication architecture, as it is known from documents EP3547620 A1 and US 2019/0294572 A1 previously cited.

Therefore, one or more embodiments may relate to a robust master-slave communication bus interface that can be used under automotive conditions, which in the following may be referred to with the designation "CAN FD Light."

It is noted that, while reference to a CAN FD protocol may be extensively made in the present description for the sake of example only, one or more embodiments may be applied to different types of CAN protocols such as, for instance, a CAN XL protocol.

One or more embodiments may be applicable to a bus system, as exemplified in FIG. 1. The bus system may include a communication master device 10 and a set of communication slave devices 20₁, 20₂, . . . , 20ₙ coupled via a bus 30 (e.g., a differential wiring bus) and supplied with power from a power source 40 (e.g., a battery provided in a vehicle V).

The master device 10 may be implemented in an electronic control unit (ECU) configured to control at least one lighting device (e.g., a LED lighting device) such as a front light, a rear light, or an interior light of the vehicle V (e.g., a "zone controller").

It is noted again that reference to a lighting system in a vehicle is made by way of example only. A communication architecture as disclosed herein may generally be applied to any communication system in a vehicle, comprising a "zone controller" or "domain controller" which is configured to process data and control actuators, and a set of sensors/actuators coupled to the zone controller via a bus network. For instance, one or more embodiments may relay to a battery management system or an advanced driver assistance system.

The master device 10 may include: a main (e.g., buck) converter 101 coupled to the power source 40, an optional (e.g., buck) converter 102 coupled to the power source 40, a low-dropout (LDO) linear voltage regulator, stand by, reset and window, and watchdog circuit block 103, voltage supervisor, power good, oscillator and enable circuit blocks 104, a microcontroller unit 106, an optional transceiver circuit 105 for communication with other ECUs possibly included in the vehicle V (e.g., a LIN2.2/HS-CAN transceiver), and an optional access point to an external communication bus 107 connected to the transceiver 105 for communication with other ECUs included in the vehicle V.

The slave devices may be implemented as "satellite" devices (e.g., as LED driver circuits).

According to a master-slave communication scheme, in one or more embodiments, the slave devices 20₁, 20₂, . . . , 20ₙ may send messages (or frames) only upon receiving a request from the master device 10. One or more embodiments may not involve a collision resolving method, since collisions can be avoided during normal operation. A collision can be treated as an error.

In normal operation, the master device 10 may send data messages to the slave devices 20₁, 20₂, . . . , 20ₙ in defined time intervals. Such data messages can be received by all the slave devices connected to bus 30, and the data stream can be used by the slave devices as network heartbeat or watchdog. If a data message is not received at a slave device within a defined time interval, the slave device may enter a fail-safe (or limp-home) mode.

In one or more embodiments, CAN FD frames, according to the CAN FD Light specification, may be sent and received by the microcontroller 106 over bus 30 without resorting to a dedicated CAN FD peripheral. The CAN IP may be emulated via software, using (only) a standard peripheral conventionally implemented in most low-cost automotive microcontrollers.

In one or more embodiments, such a peripheral may include a timer module and the direct memory access (DMA) controllers of the microcontroller 106. Optionally, such a peripheral may include a cyclic redundancy check (CRC) module of the microcontroller 106.

Figure 2:
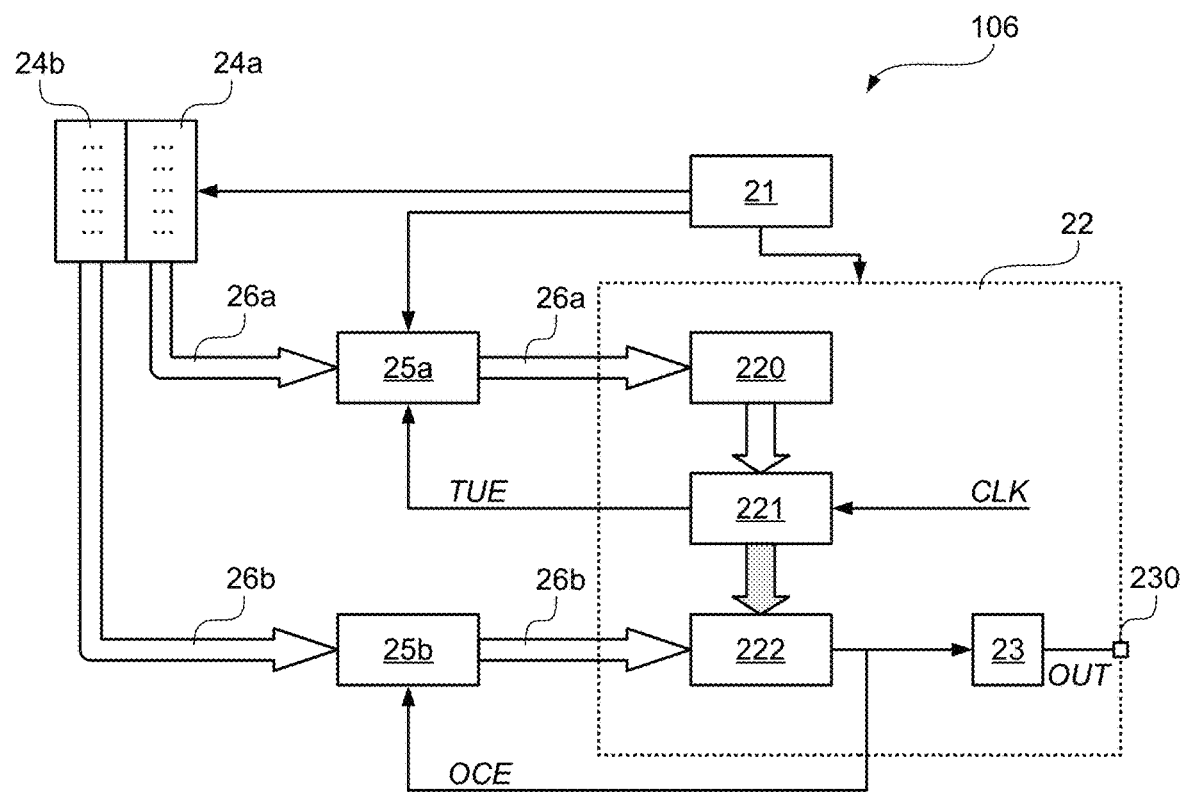
FIG. 2 is a block diagram of an embodiment microcontroller unit.

FIG. 2 is a circuit block diagram exemplary of certain components of a microcontroller unit 106 according to one or more embodiments. Microcontrollers available with companies of the STMicroelectronics group under the family trade designation "STM32" are exemplary microcontrollers that may be used in one or more embodiments.

As exemplified in FIG. 2, a microcontroller unit 106 according to one or more embodiments may include: a central processor (CPU) 21, a timer module (or timer circuit) 22, a random access memory (RAM) array comprising a first RAM memory bank (or array) 24a and a second RAM memory bank (or array) 24b, a first DMA controller 25a coupling the first RAM memory bank 24a to the timer module 22, and a second DMA controller 25b coupling the second RAM memory bank 24b to the timer module 22.

As exemplified in FIG. 2, the timer module 22 may include: an auto-reload register (ARR) 220 coupled to the first RAM memory bank 24a via the first DMA controller 25a to receive data therefrom, a counter circuit (CTR) 221 configured to receive a clock signal CLK and to receive data from the auto-reload register 220, and a first timer channel comprising a first capture/compare register 222 and an output control circuit 23 coupled to an output control pin 230.

As exemplified in FIG. 2, the first capture/compare register 222 may be coupled to the second RAM memory bank 24b via the second DMA controller 25b to receive data therefrom. The first capture/compare register 222 is coupled to the counter circuit 221 to receive data therefrom, and it is coupled to the output control circuit 23 to provide data thereto. The first capture/compare register 222 may be configured to operate as an output compare register (OCR). The output control circuit 23 is configured to provide an output pulse-width modulated (PWM) signal OUT to the output control pin 230 of the timer module 22.

The hardware architecture and conventional functioning of a timer module 22 provided in a microcontroller 106 is known in the art (see, for instance, the Application Note AN4776 Rev 3 by STMicroelectronics, "General-purpose timer cookbook for STM32 microcontrollers", updated July 2019, and the Application Note AN4013 Rev 8 by STMicroelectronics, "STM32 cross-series timer overview", updated September 2019, both available online at st.com) and therefore will not be further discussed herein.

In one or more embodiments, frames according to the CAN FD Light protocol may be transmitted by the microcontroller 106 on bus 30 resorting to the timer module 22, which drives the output control pin 230. The timer module 22, and in particular the first timer channel thereof, may be configured in an operation mode suitable for the generation of a pulse-width modulated (PWM) signal at the output control pin 230. In such operation mode, the counter circuit 221 is set in up-counting mode and resets its internal count number (e.g., to zero) when it reaches the value corresponding to the value stored in the auto-reload register 220. The PWM signal OUT generated at the output control pin 230 may be set to a first value (e.g., a low level or "0", corresponding to a dominant value in the CAN standard) as a result of the current value of the counter circuit 221 being lower than the current value of the OCR register 222, and to a second value (e.g., a high level or "1", corresponding to a recessive value in the CAN standard) as a result of the current value of the counter circuit 221 being higher than the current value of the OCR register 222.

In one or more embodiments, the period of the generated PWM signal OUT may therefore be determined as a function of a current value of the auto-reload register 220, and the duty-cycle of the generated PWM signal OUT may be determined as a function of a current value of the output compare register 222. The output compare channel of the output compare register 222 is coupled to the output control circuit 23, so that the signal OUT at the output control pin 230 changes its state (e.g., high or low) as a function of the current values of the registers 220 and 222.

In one or more embodiments, the period or the duty-cycle of the generated PWM signal OUT are configurable "on the run" (e.g., in real time), and their values can be modified at each period of the PWM signal. The values of the period or the duty-cycle of the generated PWM signal can be configured by updating (autonomously) the values of the auto-reload register 220 or of the output compare register 222 via the DMA controllers 25a, 25b (e.g., using two independent DMA channels 26a, 26b). Therefore, a microcontroller 106 according to one or more embodiments may include a first DMA channel 26a for carrying out the value update of the ARR register and a second DMA channel 26b for carrying out the value update of the OCR register.

In one or more embodiments, the first or second DMA channel(s) may be configured to update the value of respective destination register(s) (ARR or OCR) in response to a respective trigger event generated by the timer module 22 being sensed. For instance, the first DMA controller 25a may be sensitive to a "timer update event" signal TUE generated by the counter circuit 221, and the second DMA controller 25b may be sensitive to an "output compare event" signal OCE generated by the OCR register 222.

In one or more embodiments, an update of the ARR register 220 or of the OCR register 222 may be performed "automatically" (i.e., without influence (operation) of the central processor 21) so that the whole transmission process of an entire CAN frame may not load the central processor 21 following the configuration of the peripherals and the start of the frame transmission process. Configuration of the timer module 22, of the DMA controllers 25a, 25b, and the RAM memory banks 24a, 24b may be performed by a software routine running on the main CPU core 21.

Figure 4:
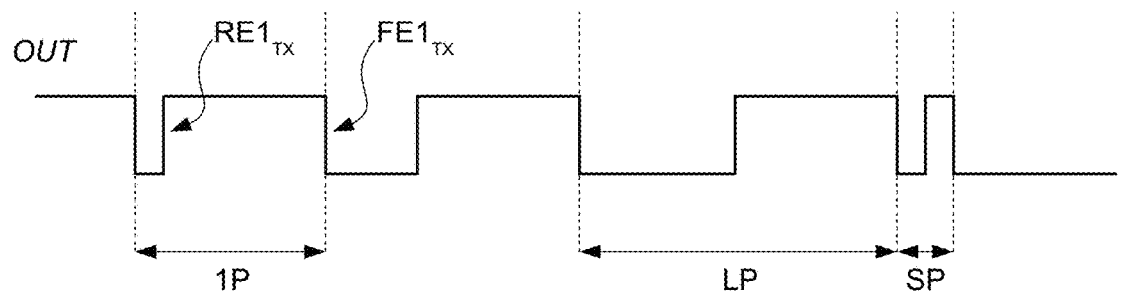
FIG. 4 is a possible time evolution of an embodiment PWM signal generated by, for example, a microcontroller unit for sending a CAN frame.
Figure 3:
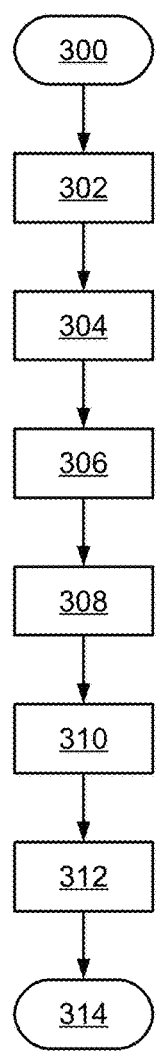
FIG. 3 is a flow diagram of an embodiment method implemented by, for example, a microcontroller unit for sending a CAN frame.

Transmission of a CAN FD frame by a microcontroller 106 as exemplified in FIG. 2 will now be further discussed with reference to FIGS. 3 and 4. FIG. 3 is a flow diagram exemplary of processing steps implemented by the microcontroller 106 for sending a CAN frame. FIG. 4 is exemplary of a possible time evolution of a PWM signal OUT generated by the microcontroller 106.

In one or more embodiments, the CAN frame is composed by a software pre-processing procedure running in the CPU core 21 as a function of values entered by a top-level application. The pre-processing procedure may include bit stuffing and calculation of a CRC code. Such pre-processing may not be needed in case a standard CAN peripheral is used for transmission of the CAN frame.

In one or more embodiments, the pre-processing procedure run by the CPU core 21 generates a frame bit stream as should be visible on the CAN bus (e.g., to the slave devices). However, such a format may not be suitable for usage by the timer module 22 to emulate the operation of a CAN system. In a following step, the CAN frame bit stream is decomposed into PWM parameters to be used as an input for the timer module 22. Such CAN frame pre-processing steps are exemplified in the flow diagram of FIG. 3.

As exemplified in FIG. 3, the transmission procedure of a CAN frame by the microcontroller 106 may start at a start step 300. At step 302, the CPU core 21 may get (e.g., from a top-level application running in the microcontroller 106) the data to be transferred via a CAN frame over the bus 30.

At step 304, the CPU core 21 may generate a raw CAN frame. For instance, the raw CAN frame may include an identification (ID) field, a data length code (DLC) field, the corresponding data bytes (e.g., up to 64 data bytes), and one or more control bits.

At step 306, the CPU core 21 may apply bit stuffing processing to the generated raw CAN frame.

At step 308, the CPU core 21 may calculate a CRC code as a function of the raw CAN frame and may insert the CRC code into the raw CAN frame.

After the CRC calculation at step 308, the raw CAN frame may essentially include a sequence of bits assuming either value "1" or "0", according to the data which has to be transmitted on bus 30.

At step 310, the CPU core 21 may fragment (or decompose) the raw CAN frame into PWM periods for the subsequent generation of the PWM signal OUT by the timer module 22, as further detailed below.

In one or more embodiments, the frame decomposition starts from the frame SOF (start-of-frame) bit of the raw CAN frame. The number of consecutive dominant bits (e.g., "0" bits) is counted until the first recessive bit (e.g., "1" bit) is detected. This counted value of consecutive dominant bits determines the duty-cycle (e.g., the length of the PWM "low" pulse) of the first PWM period. Subsequently, the following consecutive recessive bits are counted until the next dominant bit is detected. This counted value of consecutive recessive bits, plus the previously counted value of consecutive dominant bits, determines the duration of the entire PWM period. The next dominant bit is considered as a start of a new PWM period.

The procedure of counting consecutive dominant bits and consecutive recessive bits is repeated for the entire raw CAN frame until the EOF (end-of-frame) field. The last PWM period may be longer and may contain at least eleven (11) recessive bits (ACK delimiter plus EOF field plus IFS field).

According to the CAN specification (e.g., ISO 11898-1) and applying bit stuffing, a CAN frame may include a maximum of five (5) consecutive bits having the same value. Therefore, the maximum duration of a PWM period may correspond to a length of ten (10) bits (i.e., five dominant bits followed by five recessive bits), as exemplified by the PWM period labeled LP in FIG. 4.

The minimum duration of a PWM period may correspond to a length of two (2) bits (i.e., one dominant bit followed by one recessive bit), as exemplified by the PWM period labeled SP in FIG. 4. FIG. 4 also shows the first PWM period, labeled 1P. In one or more embodiments, all lengths of a PWM period from two (2) bits up to ten (10) bits are possible. A longer PWM period can appear only at the end of the CAN frame, containing (e.g., eleven (11) recessive bits), as previously discussed.

In one or more embodiments, the information computed by the frame fragmentation (or decomposition) procedure 310 (e.g., duration and duty-cycle of each PWM period of an entire CAN frame) may be stored in a local memory of the microcontroller 106 (e.g., in the two RAM memory banks 24a, 24b).

For instance, the lengths (or durations) of each PWM period of the CAN frame may be stored in the first RAM memory table 24a, which is coupled to the ARR register 220 via the first DMA channel 26a and DMA controller 25a. The widths of the "low" (dominant) pulses of each PWM period of the CAN frame, derived from the PWM duty-cycle values, may be stored in the second RAM memory table 24b, which is coupled to the OCR register 222 via the second DMA channel 26b and DMA controller 25b. A link between the RAM memory tables 24a and 24b may be kept so as to correctly associate the same table index of a period value stored in the first memory table 24a to the corresponding duty-cycle value stored in the second memory table 24b.

In one or more embodiments, after a CAN frame is composed (steps 302 to 308), fragmented into a set of PWM period values and respective duty-cycle values (step 310) and these values are stored into the RAM memory tables 24a and 24b, the RAM memory tables 24a and 24b are configured (by the CPU core 21) to be the data source for the ARR register 220 and the OCR register 222 of the timer module 22, via the DMA controllers 25a and 25b. After the PWM parameters are stored in the RAM memory tables 24a and 24b and the DMA controllers 25a, 25b are configured, the timer module 22 can be started at step 312. Configuration of the RAM memory tables 24a and 24b, of the DMA controllers 25a and 25b, and of the timer module 22 may be performed via software running on the CPU core 21. After transmission of a CAN frame is started, the CPU core 21 may not be further involved in the CAN frame transmission process and may thus be free to run other tasks by returning to an upper process (step 314 of FIG. 3).

As a result of the timer module 22 being triggered for CAN frame transmission (step 312 of FIG. 3), the first values stored in the RAM memory tables 24a and 24b are read and stored in the respective registers 220 and 222 (i.e., the registers 220 and 22 are initialized), and the CAN frame transmission starts with the first PWM period, starting with a low-level pulse (see, for instance, the first portion of the period 1P in FIG. 4). At the end of the low-level pulse (e.g., at the first raising edge $RE_{1TX}$ of the output PWM signal OUT, which takes place as a result of the value of the counter 221 exceeding the current value stored in the OCR register 222), a DMA request is raised (or issued) at the second DMA controller 25b (e.g., because a rising edge in the output PWM signal OUT corresponds to a detected event in the "output compare event" signal OCE). Therefore, new data regarding the duty-cycle of the next PWM period is read from the second RAM table 24b and loaded into the OCR register 222. The resulting PWM pulse configuration will be applied for the generation of the next PWM period. At the end of the first PWM period (e.g., at the first falling edge $FE_{1TX}$ of the output PWM signal OUT, which takes place as a result of the value of the counter 221 being reset to zero after having reached the current value stored in the ARR register 220), a DMA request is raised (or issued) at the first DMA controller 25a. Therefore, new data regarding the duration of the next PWM period is read from the first RAM table 24a and loaded into the ARR register 220. The process is repeated until the end of the CAN frame by configuring the DMA controllers 25a, 25b with the appropriate number of requested DMA transfers.

Those of skill in the art will understand that, as an alternative, a DMA request may be raised (or issued) at the second DMA controller 25b for loading a new value into the OCR register 222 at the end of the high-level pulse (i.e., at the falling edges of the output PWM signal OUT), possibly being triggered by the same control signal TUE. In one or more embodiments, reading the values of PWM pulse length (from memory 24a) and PWM pulse width (from memory 24b) may be executed at the same time and as a function of the same signal.

In one or more embodiments, the depth of the RAM tables 24a, 24b may be optimized according to the length of the longest expected transmitted CAN frame.

In one or more embodiments, to allow the CPU core 21 to detect the end of transmission of a CAN frame, a software interrupt routine may be triggered by the DMA controller(s) in response to the DMA controller(s) processing the last configured transfer. In response to such an interrupt being raised (or issued), the CPU core 21 may stop the timer module 22 to avoid repeating the last PWM period on bus 30.

In one or more embodiments, a longer PWM period with a duty-cycle equal to zero can be inserted at the end of the RAM memory array tables 24a, 24b (which store the PWM parameters) for safety reasons to keep the output pin 230 of the timer module 22 at a recessive value until the timer module 22 is properly stopped by the interrupt routine and the bus 30 is not disturbed. For instance, the minimum length of such a last PWM "safety period" may be set according to the reaction time of the COU core 21 or depending on its load by other running tasks.

As previously discussed, based on the fragmentation principle, the shortest PWM period that can be generated by the timer module 22 corresponds to a 2-bit time value (e.g., consisting of one dominant bit and one recessive bit). The longest PWM period that can be generated by the timer module 22 corresponds to a 10-bit time value. The standard pulse width may be set from 1-bit time value up to 5-bit time value. Therefore, the frequency of the clock signal CLK received at the timer module 22 (possibly pre-scaled by a pre-scaler circuit, not visible in the Figures) may be configured to allow these settings. For instance, the main clock frequency may be set accordingly by using the right frequency-setting external components (e.g., crystal, capacitances, etc.), or the clock signal CLK may be derived by programming the PLL, the pre-scaler or the post scaler (frequency dividers), where the PLL derives its frequency from the main clock.

In one or more embodiments, the microcontroller 106 may also be configured to receive CAN FD frames from bus 30 (e.g., to receive diagnosis frames generated by the slave devices).

Receiving CAN FD frames may be more complicated than transmitting CAN FD frames because the incoming frames are asynchronous and may thus involve synchronization. The CAN FD Light protocol specification introduces some simplifications to the standard CAN FD protocol, which may facilitate emulating by software a CAN FD "receiving" peripheral in the microcontroller 106. For instance, simplifications of the CAN FD Light protocol compared to the standard CAN FD protocol are the following: an acknowledgment (ACK) by the master device is not required and is not evaluated by the slave devices, thereby allowing the master device to postpone processing of the received frames, the slave frequency is well aligned to master request, error frames are not sent by the master device or by the slave devices, the slave devices expect no retransmission of frames, and end of receive is recognized by an occurrence of any edge for a time longer than 7 bits or by expiration of the time corresponding to the expected frame maximum length.

Figure 5:
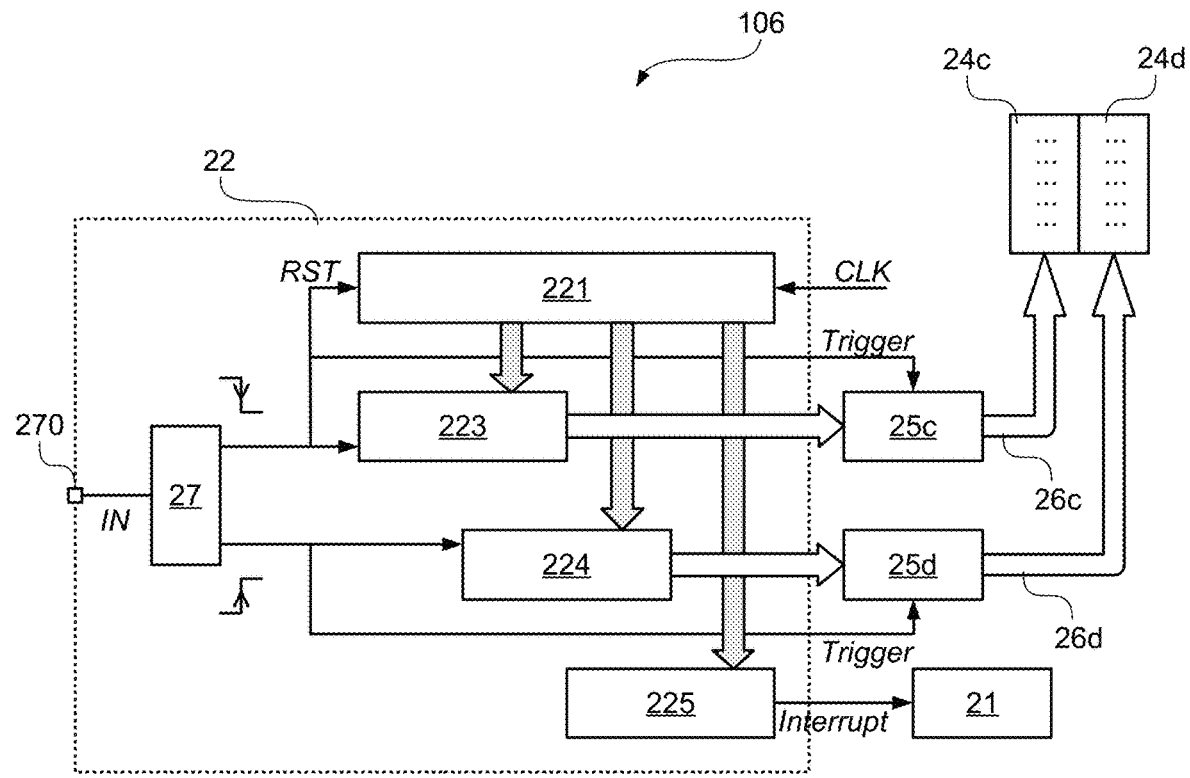
FIG. 5 is a block diagram of an embodiment microcontroller unit.

FIG. 5 is a circuit block diagram exemplary of specific components of a microcontroller unit 106 according to one or more embodiments. Components that have already been described with reference to FIG. 2 are indicated by the same reference/numerals (e.g., the CPU core 21 and the timer module 22), and a corresponding description will not be repeated herein.

As exemplified in FIG. 5, the microcontroller unit 106 may include, in addition to the elements disclosed with reference to FIG. 2: a RAM memory array comprising a third RAM memory bank (or array) 24c and a fourth RAM memory bank (or array) 24d, a third DMA controller 25c coupling the timer module 22 to the third RAM memory bank 24c, and a fourth DMA controller 25d coupling the timer module 22 to the fourth RAM memory bank 24d.

As exemplified in FIG. 5, the timer module 22 in the microcontroller unit 106 may include, in addition to the counter circuit 221 and the other registers (ARR and OCR) disclosed with reference to FIG. 2: an edge detector circuit 27 coupled to a timer input pin 270, the timer input pin 270 configured to be coupled to the communication bus 30 to receive therefrom an input signal IN conveying CAN frames, with the edge detector circuit 27 configured to provide a first output signal indicative of sensed falling edges and a second output signal indicative of sensed rising edges, a second timer channel comprising a second capture/compare register 223 sensitive to falling edges detected by the edge detector circuit 27 and coupled to the third DMA controller 25c to provide data thereto, a third timer channel comprising a third capture/compare register 224 sensitive to rising edges detected by the edge detector circuit 27 and coupled to the fourth DMA controller 25d to provide data thereto, and a fourth timer channel comprising a fourth capture/compare register 225 coupled to the CPU core 21.

The second capture/compare register 223 may be configured to operate as a capture register. Thus, it may capture the current value of the counter circuit 221 in response to a falling edge being detected in the PWM signal IN. The third capture/compare register 224 may be configured to operate as a capture register. Thus it may capture the current value of the counter circuit 221 in response to a rising edge being detected in the PWM signal IN. The fourth capture/compare register 225 may be configured to operate as a compare register. Thus it may compare the current value of the counter circuit 221 to a threshold value (e.g., a fixed threshold value).

Therefore, in one or more embodiments, two input capture (IC) channels (capture registers 223, 224) of the timer module 22 may be used in the slave mode configuration for detecting the input PWM signal received at pin 270. The input capture registers 223, 224 can store the current value of the counter circuit 221 as a result of being triggered. The first capture register 223 is triggered by falling edges of the input signal received at pin 270, and the second capture register 224 is triggered by rising edges of the input signal received at pin 270.

Figure 6:
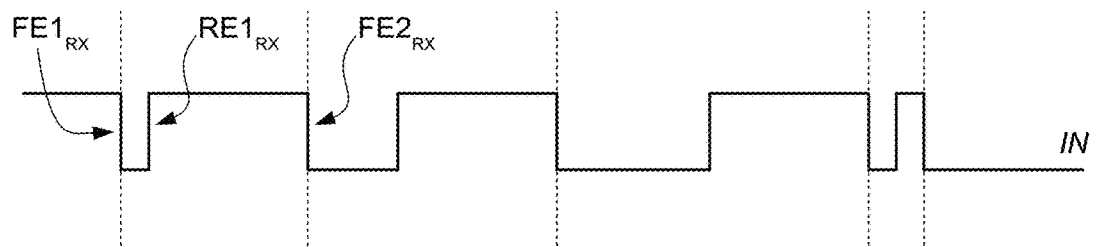
FIG. 6 is a possible time evolution of an embodiment PWM signal sensed by, for example, a microcontroller unit for receiving a CAN frame.

FIG. 6 is exemplary of a possible time evolution of a PWM signal IN received by the microcontroller 106 at the input pin 270.

As exemplified in FIG. 6, a first falling edge $FE_{1RX}$ in the received PWM signal IN triggers the storage of a current value of the counter circuit 221 into the capture register 223 and resets the value of the counter circuit 221 (signal RST). The next rising edge $RE_{1RX}$ in the received PWM signal IN triggers the storage of the current value of the counter circuit 221 into the capture register 224. Another falling edge $FE_{2RX}$ in the received PWM signal IN triggers again the storage of the current value of the counter circuit 221 into the capture register 223 and resets the value of the counter circuit 221 (signal RST) to start a new measurement for a new PWM period.

In response to a new value being stored (e.g., captured) into one of the capture registers 223 and 224, the corresponding DMA controller 25c or 25d is also triggered, and the new value is stored into the respective RAM memory table 24c or 24d.

In one or more embodiments, the RAM memory tables 24c and 24d have the same structure as the RAM memory tables 24a and 24b (which store the data for generating and transmitting the CAN FD frames). Data indicative of the length (or duration) of each PWM period of the received CAN frame may be stored in the third RAM memory table 24c, which is coupled to the capture register 223 via the third DMA channel 26c and DMA controller 25c. The width of the pulse of each PWM period of the received CAN frame, derived from the PWM duty-cycle value, may be stored in the fourth RAM memory table 24d, which is coupled to the capture register 224 via the fourth DMA channel 26d and DMA controller 25d.

In one or more embodiments, the depth of the RAM tables 24c, 24d may be optimized according to the length of the longest expected received CAN frame.

In one or more embodiments, the DMA controllers 25c, 25d may be configured to transfer a maximal theoretically possible number of periods to allow for reception of the longest frame encoded according to the CAN FD Light specification. Also, the depth of the RAM memory tables 24c, 24d may be set accordingly.

The conventional maximal possible payload for a CAN FD frame is equal to 64 data bytes, corresponding to a minimal frame length of 568 bits, resulting in a frame containing a number of PWM periods lower than or equal to 284. The minimal frame length may be calculated according to the CAN specification (e.g., ISO 11898-1) if no additional stuffing bits are inserted but only the mandatory fixed stuffing bits are inserted. Therefore, the maximal frame length (including the stuffing bits) may be around 700 bits, depending on the exact content of the frame. However, such a frame must contain less PWM periods than a frame with minimal length.

The maximal number of PWM periods is expected in the case where the frame contains as many alternating consecutive bits ("01") as possible, resulting in a sequence of alternating values ("0101010101 . . . "). In such a case, each PWM period has a length of only 2 bits, thus resulting—for a frame with full payload of 64 bytes—into a maximal number of PWM periods being received and stored inside the RAM tables 24c, 24d.

A frame containing the maximal number of stuffing bits has a data structure including alternating groups of 5 bits having the same value (e.g., " . . . 0000011111000001111 . . . "). In such a case, the received PWM periods have a length of 10 bits and a frame with full payload of 64 bytes contains less PWM periods if compared to the previous case, resulting in less data values being stored into the RAM tables 24c, 24d.

In one or more embodiments, the DMA controllers 25c, 25d are configured to transfer from the timer module 22 to the RAM memory tables 24c, 24d data indicative of a number of PWM periods slightly higher than the maximum theoretically expected number of PWM periods. This may facilitate catching and eliminating, by software post-processing, possible "spikes" or disturbances on the bus 30 in the time period between the initialization of the receiving process and the start of frame (since the start of transfer depends only on the slave device), and avoiding stopping the data transfer before having fully received the incoming frame. Purely by way of non-limiting example, a value of around 350 DMA transfers may be suitable to properly receive a CAN frame with a full payload of 64 data bytes.

Additionally or alternatively, in one or more embodiments, a mechanism for end-of-frame detection may be implemented to correctly detect the end of the received frame despite the number of PWM periods inside the received frame being unpredictable (since the number of received PWM periods depends on the frame content).

As exemplified in FIG. 5, such an end-of-frame detection mechanism may be implemented by the fourth channel of the timer module 22 (i.e., the compare register 225). The register 225 may be configured to operate in compare mode, sharing the same counter circuit 221, and may be configured to issue an interrupt signal due to detecting a PWM period longer than a certain threshold (e.g., 10 bits).

For instance, a time value corresponding to the duration of 11 bits may be pre-loaded into the compare register 225. In response to the counter circuit 221 reaching the time value, the interrupt signal Interrupt is issued by the compare register 225 towards the CPU core 21. The CPU core 21 may thus react on the received interrupt, terminating the receive operation and starting a software procedure for frame evaluation (e.g., frame decoding).

As previously discussed, 10 bit is the maximal possible duration of a PWM period inside a CAN FD frame. Longer PWM periods can be received upon the occurrence of an error frame (not considered in the CAN FD Light specification) or at the end of the frame. The counter circuit 221 is reset at the beginning of each PWM period (e.g., starting with a dominant pulse, see the reset signal RST being asserted at the falling edges detected by the edge detector 27) so that the target value of 11 bits and more can be reached (only) at the end of the frame, when the ACK delimiter, the EOF field, and the IFS field are received.

Figure 7:
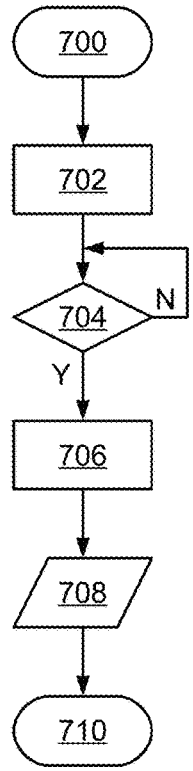
FIG. 7 is a flow diagram of an embodiment method implemented by, for example, a microcontroller unit for receiving a CAN frame.

FIG. 7 is a flow diagram exemplary of processing steps implemented by the microcontroller 106 for receiving a CAN frame. As exemplified in FIG. 7, the reception procedure of a CAN frame by the microcontroller 106 may start at step 700.

At step 702, the hardware timer module 22 may be initialized to receive the input signal IN, process it into the timer module 22, and store the relevant parameters of the received PWM periods into the RAM memory tables 24c, 24d.

At step 704, the reception procedure may include checking whether the CAN frame has been completely received (EOF field received) or not. In response to a negative outcome (N) of step 704, the timer module 22 may continue processing the input signal IN while the CPU core 21 remains free for executing other processes.

In response to a positive outcome (Y) of step 704, the CPU core 21 may be notified of the frame reception being terminated and may start processing the values stored in the RAM memory tables 24c, 24d to reconstruct the content of the CAN frame (step 706).

Once the content of the CAN frame has been completely reconstructed by the CPU core 21, the corresponding data may be transferred to an upper process at step 708, and the frame reception process may be terminated at step 710 (e.g., with the CPU core 21 returning to an upper process).

Therefore, in one or more embodiments, as a result of a CAN frame being fully received at the timer module 22, the content of the CAN frame may be decoded (e.g., for being forwarded to an upper-level application). The frame reception process is carried out by the timer module 22 without any intervention of the CPU core 21. As a result of the frame reception being completed, the CPU core 21 is notified by the software interrupt (e.g., generated by the compare register 225), and the frame post-processing can be started by the CPU core 21.

Figure 8:
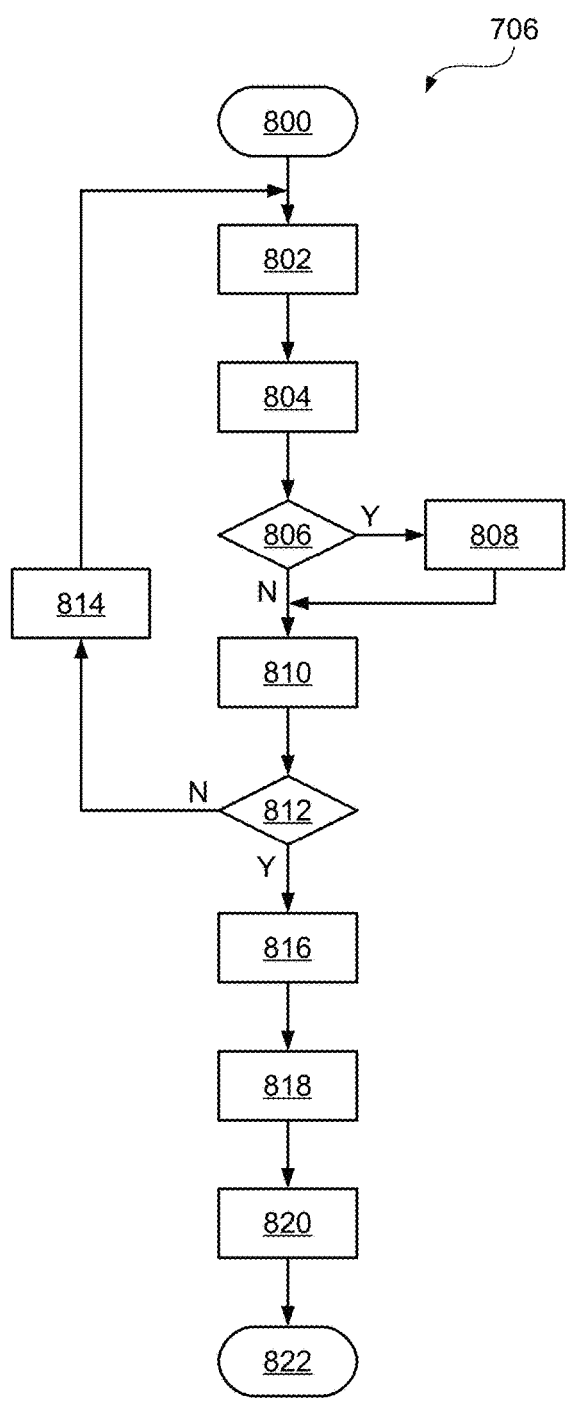
FIG. 8 is a flow diagram of an embodiment method implemented by, for example, a microcontroller unit for processing a received CAN frame.

FIG. 8 is a flow diagram exemplary of processing steps implemented by the CPU core 21 for processing a received CAN frame and reconstructing its content, as previously discussed with reference to step 706.

As exemplified in FIG. 8, processing of a received CAN frame by the CPU core 21 may start at step 800.

At step 802, the CPU core 21 may read data indicative of the duration and duty-cycle of a PWM period from corresponding lines of the RAM memory tables 24c and 24d to convert one PWM period to a corresponding bit sequence.

At step 804, the CPU core 21 may store the bit sequence generated at step 802 into a first buffer.

At step 806, the CPU core 21 may check for the presence of stuffing bits into the bit sequence generated at step 802 and stored into the first buffer.

As a result of a positive outcome (Y, indicating the presence of stuffing bits) of step 806, the CPU core 21 may remove in a step 808 the stuffing bits from such a bit sequence to generate a second, "de-stuffed" bit sequence.

As a result of a negative outcome (N, indicating the absence of stuffing bits) of step 806, or following step 808, the CPU core 21 may store in step 810 the de-stuffed bit sequence (or the original bit sequence, in the case it did not contain any stuffing bits) into a second buffer.

At step 812, the CPU core 21 may check whether the lastly processed PWM period was the last period of the received CAN frame or not.

As a result of a negative outcome (N) of step 812, the CPU core may move to processing a subsequent PWM period (step 814) (i.e., it may return to step 802 to read data indicative of the duration and duty-cycle of a subsequent PWM period from corresponding lines of the RAM memory tables 24c and 24d to convert the subsequent PWM period to a corresponding bit sequence).

As a result of a positive outcome (Y) of step 812, at step 816 the CPU core 21 may extract the values carried by the CAN frame (e.g., the CAN ID field, the CAN DLC field, the payload, etc.) from the "de-stuffed" bit sequence stored in the second buffer.

At step 818, the CPU core 21 may find the first fixed stuff bit position, and at step 820, the CPU core 21 may process the "stuffed" bit sequence stored in the first buffer for CRC validation.

Processing a received CAN frame by the CPU core 21 may eventually end at step 822.

Therefore, in one or more embodiments, processing of a received CAN frame may include sequentially reading the values of the measured PWM periods and duty-cycles from the RAM memory tables 24c and 24d, converting the PWM periods and duty-cycles into respective sequences of bits, and storing such sequences of bits into a first buffer ("stuffed" sequences) and into a second buffer ("de-stuffed" sequences). During the defragmentation process, the stuffing bits are thus detected and removed from the bit sequences, and the stream without stuffing bits is stored to the second buffer, so that two different bit streams are stored into memory—a first one with the original frame data, and a second one containing the frame data without the stuffing bits—as a result of the defragmentation process.

In one or more embodiments, the conversion from PWM data stored in the RAM memory tables 24c and 24d (i.e., data indicative of the duration of a PWM period and its duty-cycle, where the duty-cycle is indicative of the length of the dominant pulse) to a corresponding sequence of bits (as discussed with reference to step 802 exemplified in FIG. 8) may be implemented according to the procedure discussed in the following. As a first step, the duration of the whole PWM period may be converted to a number of bits. In an embodiment, the measured period length may be divided by an ideal (e.g., expected) duration of a single bit, and the integer part of the result may be selected as the number of bits contained in the whole PWM period. As a second step, the number of dominant bits in the PWM period can be computed in a similar way, starting from the data indicative of the duty-cycle of the PWM period. Eventually, the number of recessive bits in the PWM period can be calculated as the total number of bits in the PWM period minus the number of bits in the dominant pulse. The number of dominant bits and the corresponding number of recessive bits can then be inserted into the arrays where the defragmented bit streams are stored. The number of dominant or recessive bits stored into the "de-stuffed" array is reduced in case some stuffing bits are removed.

Optionally, a certain time value corresponding to a clock tolerance value may be added to the measured period length before dividing the period length by the duration of a single bit to compute the number of bits contained in the whole PWM period. For instance, the value of maximal acceptable clock tolerance for 10 bits may be added to the measured period length. The value obtained can be divided by the ideal duration of a single bit.

In one or more embodiments, averaging the bit time can be used to adjust the expected bit time value.

However, one or more embodiments may not rely on such averaging insofar as the slave devices may be able to provide good short-time clock stability. For instance, the maximal tolerance may be set around 30% of the bit time, which facilitates eliminating unexpected spikes shorter than 1-bit time and accepting maximal clock tolerance of 3% for the longest PWM periods.

In case a wider clock error tolerance is demanded, the maximal tolerance can be adjusted. For instance, the value can be theoretically set from 0% to 50%. However, values close to zero may not allow any clock tolerance between nodes, which would be barely possible to operate. On the other hand, values over 50% could cause uncertainty of the bit number detection. The value of 30% may represent a satisfactory compromise to provide sufficient tolerance for clock inaccuracy and provide some margin for bit aliasing.

In one or more embodiments, the frame values until the last data byte can be extracted from the "de-stuffed" bit sequences stored in the second buffer according to the CAN FD specification. The position of the first fixed stuff bit and the CRC field can be located to determine the target point for CRC validation. The CRC verification can be done subsequently, using the original "stuffed" bit sequences stored in the first buffer. It is noted that according to the CAN FD specification, the CRC can be calculated from the raw data, including the stuffing bits, starting from the frame SOF until the beginning of the CRC field, but excluding the fixed stuffing bits.

In one or more embodiments, the calculated CRC value can be compared with the CRC value of the received frame. As a result of a positive outcome of such comparison, the frame can be considered valid, and the parsed frame data can be forwarded to an upper-level application for further processing.

In one or more embodiments, the microcontroller 106 may include a plurality of timer modules 22 (e.g., two timer modules) and a respective plurality of DMA channels (e.g., four DMA channels). The system clock frequency may be as high as 48 MHz.

Purely by way of non-limiting example, the microcontroller available with companies of the STMicroelectronics group under the trade designation STM32F072 is exemplary of a microcontroller suitable for use in one or more embodiments. For instance, the TIM3 timer (16 bit) of the microcontroller may be used for transmitting frames, and the TIM2 timer (32 bit) may be used for receiving frames.

Purely by way of non-limiting example, the timer input clock frequency may be equal to 48 MHz, with typical precision possibly around 0.001%. This defines 96 timer oscillations for a 1-bit time at the rate of 500 kbit/s, and 48 timer oscillations for a 1-bit time at 1 Mbit/s. In one or more embodiments, the bit rate can be adjusted with the smallest possible step, approximately 1% for 500 kbit/s and 2% for 1 Mbit/s. In one or more embodiments, the input bit time can also be sampled for the frame receiving path (e.g., 1% resolution for a data rate of 500 kbit/s), but the resolution may be constant for any length of the PWM period. Therefore, the longest period (e.g., of 10 bits) may be sampled with a 1% resolution defined by one oscillation of the timer.

One or more embodiments may provide transmission and reception processing times as reported, purely by way of non-limiting example, in Table I provided at the end of the description. For typical CAN frames, Table I reports the time involved for processing received frames and for preparing transmitted frames. It is noted that the elapsed processing time may depend on the frame length and the number of edges.

Additionally, Table II also provided at the end of the description reports, purely by way of non-limiting examples, the processing times of specific typical frames used by the CAN FD Light protocol for the master-slave communication.

One or more embodiments may thus relate to a microcontroller acting as a master device via a software-emulated CAN FD stack to handle a master-slave communication based on the CAN FD Light protocol.

In one or more embodiments, the CAN frame(s) transmitted by the microcontroller may be read back via the receiving path of the microcontroller itself (e.g., to implement a further security feature). Correctness of the transmitted frame(s) or frame acknowledgment by other node(s) in the bus may thus be evaluated by post-processing.

It is noted that one or more embodiments may not provide for handling a bus arbitration process or for acknowledging the received frames. While such functions may be involved (e.g., in a conventional CAN FD network), one or more embodiments may be advantageously applied to CAN FD Light networks, which do not rely on the arbitration/acknowledge features of conventional CAN FD networks.

It is noted that the instant description mainly refers to the use of two figures for defining the characteristics of each PWM period, namely the total duration of the PWM periods (e.g., as stored in the memory tables 24a and 24c) and the duration of the dominant pulse of the PWM periods (e.g., as stored in the memory tables 24b and 24d). Those of skill in the art will understand that a PWM period may be generally defined by any pair of parameters selected out of four interrelated parameters, namely the total duration of the period, the duration of the dominant pulse, the duration of the recessive pulse, and the duty-cycle. Therefore, the representation of a PWM period can be done in any way that defines a PWM signal. Purely by way of non-limiting examples, possible options are the length of the period and the duty-cycle, or the length of the period and the duration of a high (recessive) pulse, or the length of the period and the duration of a low (dominant) pulse, or the duration of a low (dominant) pulse and the duration of the following high (recessive) pulse, or vice versa.

Therefore, in one or more embodiments, different representations (i.e., other pairs of parameters) of the PWM pulses may be chosen to fit different implementations or configurations of the timer circuit. In one or more embodiments, the transmit part may even use a different representation to the receiving part.

As exemplified herein, a circuit (e.g., a microcontroller unit, 106) may include a first memory bank (e.g., a RAM memory, 24a), a second memory bank (e.g., a RAM memory, 24b), a processor (e.g., a CPU core, 21), and a timer circuit (e.g., 22). The processor may be configured to: i) generate an output sequence of binary values encoding an outgoing CAN frame according to a CAN protocol (e.g., a CAN FD protocol), ii) process the output sequence of binary values to detect a sequence of ordered PWM periods (e.g., 1P, SP, LP), where each PWM period includes a first portion having a dominant state or value (e.g., zero) and a second portion having a recessive state or value (e.g., one), and where each PWM period has a respective total duration and a respective duty-cycle value, iii) store into the first memory bank a set of ordered first values indicative of a first parameter of the PWM periods in the sequence of ordered PWM periods, and iv) store into the second memory bank a set of ordered second values indicative of a second parameter of the PWM periods in the sequence of ordered PWM periods, wherein the first parameter and the second parameter define a shape of the PWM periods.

As exemplified herein, the timer circuit may include: a first register (e.g., an auto-reload register, 220) configured to read from the first memory bank and store therein a value indicative of the first parameter of a current PWM period in the sequence of ordered PWM periods, a counter circuit (e.g., 221) configured to increase an internal count number and to reset the internal count number as a function of the value stored in the first register, and a second register (e.g., 222) configured to read from the second memory bank and store therein a value indicative of the second parameter of the current PWM period and compare the internal count number of the counter circuit to the value stored into the second register.

As exemplified herein, in response to the internal count number reaching the value stored into the first register, the counter circuit may trigger reading from the first memory bank and storing into the first register a subsequent value indicative of the first parameter of a subsequent PWM period in the sequence of ordered PWM periods. The second register may drive (e.g., 23) an output pin (e.g., 230) of the circuit to a dominant value or to a recessive value as a function of the comparing the internal count number of the counter circuit to the value stored into the second register, whereby the output pin provides an output PWM signal comprising the sequence of ordered PWM periods. The second register may read from the second memory bank and store a subsequent value indicative of the second parameter of a subsequent PWM period in the sequence of ordered PWM periods in response to the internal count number of the counter circuit reaching the value stored into the second register or the value stored into the first register.

As exemplified herein, the first parameter of the PWM periods may be the total duration of the PWM periods and the second parameter of the PWM periods may be the duration of the first portions of the PWM periods. The counter circuit may be configured to increase an internal count number until reaching the value stored in the first register and, in response to the internal count number reaching the value stored into the first register, to reset the internal count number and to trigger reading from the first memory bank and storing into the first register a subsequent value indicative of the total duration of a subsequent PWM period in the sequence of ordered PWM periods. The second register may be configured to: in response to the internal count number of the counter circuit being lower than the value stored into the second register, drive the output pin of the circuit to a dominant value, and in response to the internal count number of the counter circuit exceeding the value stored into the second register, drive the output pin of the circuit to a recessive value.

As exemplified herein, the processor may be configured to generate the output sequence of binary values encoding an outgoing CAN frame by generating a raw CAN frame comprising an identification field, a data length code field, a payload field and one or more control bits, applying bit stuffing processing to the raw CAN frame, thereby producing a bit stuffed raw CAN frame, calculating a CRC code as a function of the bit stuffed raw CAN frame, and inserting the calculated CRC code into the bit stuffed raw CAN frame.

As exemplified herein, the processor may be configured to process the output sequence of binary values to detect a sequence of ordered PWM periods by i) detecting a start-of-frame bit having a dominant value in the output sequence of binary values, ii) counting a number of consecutive bits having a dominant value in the output sequence of binary values until detecting a first bit having a recessive value, iii) counting a number of consecutive bits having a recessive value in the output sequence of binary values until detecting a first bit having a dominant value, and iv) repeating steps ii) and iii) until having detected and processed an end-of-frame field in the output sequence of binary values.

As exemplified herein, a circuit according to one or more embodiments may include: a first DMA controller (e.g., 25a) configured to execute a DMA memory transfer of a subsequent first value of the set of ordered first values from the first memory bank to the first register in response to the internal count number of the counter circuit reaching the value stored into the first register, and a second DMA controller (e.g., 25b) configured to execute a DMA memory transfer of a subsequent second value of the set of ordered second values from the second memory bank to the second register in response to the internal count number of the counter circuit reaching the value stored into the second register or the value stored into the first register.

As exemplified herein, the processor may be configured to count a number of the PWM periods in the sequence of ordered PWM periods. The first DMA controller may be configured (e.g., by the CPU) to execute a number of DMA transfers from the first memory bank to the first register equal to the counted number of PWM periods. The second DMA controller may be configured (e.g., by the CPU) to execute a number of DMA transfers from the second memory bank to the second register equal to the counted number of PWM periods.

As exemplified herein, the first DMA controller or the second DMA controller may be configured to issue an interrupt signal towards the processor in response to the respective number of DMA transfers executed being equal to the counted number of PWM periods.

As exemplified herein, the processor may be configured to store into the first memory bank an additional last value of the set of ordered first values, the additional last value being higher than any other value stored into the first memory bank, and store into the second memory bank an additional last value of the set of ordered second values, the additional last value being indicative of a duration equal to zero.

As exemplified herein, a circuit according to one or more embodiments may include a third memory bank (e.g., a RAM memory, 24c) and a fourth memory bank (e.g., a RAM memory, 24d). The timer circuit may further include an edge detector circuit (e.g., 27) coupled to an input pin (e.g., 270) of the circuit. The input pin may be configured to receive an input PWM signal (e.g., IN) conveying an incoming CAN frame encoded according to a CAN protocol, and the edge detector circuit may be configured to provide a first output signal indicative of falling edges detected in the input PWM signal and a second output signal indicative of rising edges detected in the input PWM signal. The timer circuit may further include a third register (e.g., 223) configured to capture a current count number of the counter circuit in response to a falling edge detected in the PWM signal, and a fourth register (e.g., 224) configured to capture a current count number of the counter circuit in response to a rising edge detected in the PWM signal. The counter circuit may be configured to reset (e.g., to zero) the internal count number in response to a falling edge detected in the input PWM signal (e.g., after the third register has captured the current count number of the counter circuit).

As exemplified herein, a circuit according to one or more embodiments may further include: a third DMA controller (e.g., 25c) configured to execute a DMA memory transfer of a current value stored into the third register to the third memory bank in response to a falling edge detected in the PWM signal, thereby storing into the third memory bank a set of ordered third values indicative of the first parameter of the PWM periods in a respective sequence of ordered PWM periods of the input PWM signal, and a fourth DMA controller (e.g., 25d) configured to execute a DMA memory transfer of a current value stored into the fourth register to the fourth memory bank in response to a rising edge detected in the PWM signal, thereby storing into the fourth memory bank a set of ordered fourth values indicative of the second parameter of the PWM periods in the respective sequence of ordered PWM periods of the input PWM signal.

As exemplified herein, the processor may be configured to process the set of ordered third values and the set of ordered fourth values to generate an input sequence of binary values encoding the incoming CAN frame.

As exemplified herein, the processor may be configured to process the set of ordered third values and the set of ordered fourth values by: i) reading a third value from the set of ordered third values and adding to the read third value a clock tolerance value to produce a corresponding adjusted third value, ii) dividing the adjusted third value by a time value indicative of an expected duration of a single bit transmitted by the incoming CAN frame to produce an integer value indicative of a total number of bits in a current PWM period, iii) reading a fourth value from the set of ordered fourth values corresponding to the read third value, and dividing the fourth value by the time value indicative of the duration of a single bit transmitted by the incoming CAN frame to produce an integer value indicative of a number of bits having a dominant state in the current PWM period, iv) subtracting the integer value indicative of a number of bits having a dominant state in the current PWM period from the integer value indicative of a total number of bits in a current PWM period to produce an integer value indicative of a number of bits having a recessive state in the current PWM period, v) generating a sequence of bits comprising the number of bits having a dominant state and the number of bits having a recessive state, and vi) repeating steps i) to v) until having processed a last third value stored in the third memory bank and a last fourth value stored in the fourth memory bank.

As exemplified herein, the processor may be configured to store the input sequence of binary values into a first buffer, remove stuffing bits from the input sequence of binary values to generate a de-stuffed input sequence of binary values, store the de-stuffed input sequence of binary values into a second buffer, extract data conveyed by the incoming CAN frame from the de-stuffed input sequence of binary values stored into the second buffer, and check validity of a CRC code as a function of the input sequence of binary values stored into the first buffer.

As exemplified herein, the timer circuit may include a fifth register (e.g., 225) configured to compare the internal count number of the counter circuit to a threshold value stored into the fifth register, and issue an interrupt signal towards the processor in response to the internal count number of the counter circuit reaching the threshold value.

As exemplified herein, a device (e.g., an electronic control unit for a vehicle, 10) may include a microcontroller circuit according to one or more embodiments and a CAN transceiver couplable to a CAN bus (e.g., 30). An output pin of the microcontroller circuit in the device may be configured to drive the CAN transceiver to transmit over the CAN bus outgoing CAN frames encoded according to a CAN protocol (e.g., a CAN FD protocol). Optionally, the device may include a power converter circuit (e.g., 101) configured to provide a regulated power supply voltage from a power source (e.g., 40).

As exemplified herein, an input pin of the microcontroller circuit of the device may be configured to receive from the CAN bus via the CAN transceiver incoming CAN frames encoded according to a CAN protocol (e.g., a CAN FD protocol).

As exemplified herein, a system according to one or more embodiments may include a first device to one or more embodiments and a set of second devices (e.g., $20_1, \ldots, 20_n$) coupled via respective CAN transceiver circuits to a CAN bus. The first device and the second devices may be configured as communication master device and slave devices, respectively.

As exemplified herein, a method of operating a circuit according to one or more embodiments may include: generating, at a processor, an output sequence of binary values encoding an outgoing CAN frame according to a CAN protocol, processing, at the processor, the output sequence of binary values to detect a sequence of ordered PWM periods, each PWM period comprising a first portion having a dominant state and a second portion having a recessive state, each PWM period having a respective total duration and a respective duty-cycle value, storing into a first memory bank a set of ordered first values indicative of the first parameter of the PWM periods in the sequence of ordered PWM periods, storing into a second memory bank a set of ordered second values indicative of the second parameter of the PWM periods in the sequence of ordered PWM periods, reading from the first memory bank and storing into a first register a value indicative of the first parameter of a current PWM period in the sequence of ordered PWM periods, increasing an internal count number of a counter circuit and resetting the internal count number of the counter circuit as a function of the value stored in the first register, reading from the first memory bank and storing into the first register a subsequent value indicative of the first parameter of a subsequent PWM period in the sequence of ordered PWM periods as a function of the value stored in the first register, reading from the second memory bank and storing into the second register a value indicative of the second parameter of the current PWM period, comparing the internal count number of the counter circuit to the value stored into the second register, driving an output pin of the circuit to a dominant value or to a recessive value as a function of the comparing the internal count number of the counter circuit to the value stored into the second register, whereby the output pin provides an output PWM signal comprising the sequence of ordered PWM periods, and reading from the second memory bank and storing into the second register a subsequent value indicative of the second parameter of a subsequent PWM period in the sequence of ordered PWM periods in response to the internal count number of the counter circuit reaching the value stored into the second register or the value stored into the first register.

Without prejudice to the underlying principles, the details and embodiments may vary, even significantly, to what has been described by way of example only, without departing from the extent of protection.

The extent of protection is determined by the annexed claims.

TABLE I

| Frame type | Frame length | Frame parameters | Tx preparation (from Tx request until SOF) | Rx data processing (from EOF to data ready) |
|---|---|---|---|---|
| Shortest, min. edges | 64 μs | ID = 0x0f0<br>DLC = 0 | 126 μs | 155 μs |
| Shortest, max. edges | 64 μs | ID = 0x555<br>DLC = 0 | 125 μs | 182 μs |
| Standard, min. edges | 127 μs | ID = 0x0f0<br>DLC = 8<br>Data = 8*0xf0 | 239 μs | 270 μs |
| Standard, max. edges | 126 μs | ID = 0x555<br>DLC = 8<br>Data = 8*0x55 | 260 μs | 402 μs |
| Longest, min. edges | 583 μs | ID = 0x0f0<br>DLC = 15<br>Data = 64*0xf0 | 1034 μs | 984 μs |
| Longest, max. edges | 580 μs | ID = 0x555<br>DLC = 15<br>Data = 64*0x55 | 1197 μs | 1918 μs |

TABLE II

| Operation type | Complete process time | Frame preparation for transmission | Received frame processing |
|---|---|---|---|
| Unicast single register read/write | 486 μs | 200 μs | 96 μs |
| Burst read operation | 976 μs | 200 μs | 464 μs |
| Broadcast PWM update | 1628-1704 μs | 1044-1096 μs | n.a. |

Although the description has been described in detail, it should be understood that various changes, substitutions, and alterations may be made without departing from the spirit and scope of this disclosure as defined by the appended claims. The same elements are designated with the same reference numbers in the various figures. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

The specification and drawings are, accordingly, to be regarded simply as an illustration of the disclosure as defined by the appended claims, and are contemplated to cover any and all modifications, variations, combinations, or equivalents that fall within the scope of the present disclosure.

What is claimed is:

1. A circuit, comprising:
   a first memory and a second memory;
   a processor coupled to the first memory and the second memory, the processor configured to:
     generate an output sequence comprising binary values encoding an outgoing Controller Area Network (CAN) frame according to a CAN protocol,
     process the output sequence to detect a sequence of ordered pulse-width modulated (PWM) periods, each PWM period comprising a first portion having a dominant state and a second portion having a recessive state, each PWM period having a respective total duration and a respective duty-cycle value, wherein the processing the output sequence comprises:
       detecting a start-of-frame bit having a dominant value in the output sequence;
       counting a first number of consecutive bits having a dominant value in the output sequence until detecting a first bit having a recessive value;
       counting a second number of consecutive bits having a recessive value in the output sequence until detecting a first bit having a dominant value; and
       repeating the counting the first number and the counting the second number until having detected and processed an end-of-frame field in the output sequence,
     store a set of ordered first values indicative of a first parameter of the PWM periods in the sequence of ordered PWM periods in the first memory, and
     store a set of ordered second values indicative of a second parameter of the PWM periods in the sequence of ordered PWM periods in the second memory, wherein the first parameter and the second parameter define a shape of the PWM periods; and
   a timer circuit comprising:
     a first register configured to read from the first memory and store a value indicative of the first parameter of a current PWM period in the sequence of ordered PWM periods;
     a counter circuit configured to:
       increase an internal count number and reset the internal count number as a function of the value stored in the first register,
       trigger reading from the first memory, and
       trigger storing into the first register a subsequent value indicative of the first parameter of a subsequent PWM period in the sequence of ordered PWM periods as a function of the value stored in the first register; and
     a second register configured to:
       read from the second memory and store a value indicative of the second parameter of the current PWM period,
       compare the internal count number of the counter circuit to the value stored into the second register,
       drive an output pin of the circuit to a dominant value or to a recessive value as a function of the comparing the internal count number of the counter circuit to the value stored into the second register, the output pin providing an output PWM signal comprising the sequence of ordered PWM periods,
read from the second memory, and
store a subsequent value indicative of the second parameter of a subsequent PWM period in the sequence of ordered PWM periods in response to the internal count number of the counter circuit reaching the value stored into the second register or in response to the internal count number of the counter circuit reaching the value stored into the first register.

2. The circuit of claim 1, wherein the first parameter of the PWM periods is the total duration of the PWM periods and the second parameter of the PWM periods is the duration of the first portions of the PWM periods.

3. The circuit of claim 2, wherein the counter circuit is configured to:
increase an internal count number until reaching the value stored in the first register;
reset the internal count number in response to the internal count number reaching the value stored into the first register;
trigger reading from the first memory; and
trigger storing into the first register a subsequent value indicative of the total duration of a subsequent PWM period in the sequence of ordered PWM periods.

4. The circuit of claim 3, wherein the second register is configured to:
drive the output pin of the circuit to a dominant value in response to the internal count number of the counter circuit being lower than the value stored in the second register; and
drive the output pin of the circuit to a recessive value in response to the internal count number of the counter circuit exceeding the value stored into the second register.

5. The circuit of claim 1, wherein generating the output sequence comprises:
generating a raw CAN frame comprising an identification field, a data length code field, a payload field, and one or more control bits;
applying bit stuffing processing to the raw CAN frame to produce a bit stuffed raw CAN frame;
calculating a cyclic redundancy check (CRC) code as a function of the bit stuffed raw CAN frame; and
inserting the calculated CRC code into the bit stuffed raw CAN frame.

6. The circuit of claim 1, further comprising:
a first direct memory access (DMA) controller configured to execute a DMA memory transfer of a subsequent first value of the set of ordered first values from the first memory to the first register in response to the internal count number of the counter circuit reaching the value stored into the first register; and
a second DMA controller configured to execute a DMA memory transfer of a subsequent second value of the set of ordered second values from the second memory to the second register in response to the internal count number of the counter circuit reaching the value stored into the second register or in response to the internal count number of the counter circuit reaching the value stored into the first register.

7. The circuit of claim 6, wherein the processor is configured to:
count a number of the PWM periods in the sequence of ordered PWM periods;

configure the first DMA controller to execute a number of DMA transfers from the first memory to the first register equal to the counted number of PWM periods; and
configure the second DMA controller to execute a number of DMA transfers from the second memory to the second register equal to the counted number of PWM periods.

8. The circuit of claim 7, wherein the first DMA controller or the second DMA controller are configured to issue an interrupt signal towards the processor in response to the respective number of DMA transfers executed being equal to the counted number of PWM periods.

9. The circuit of claim 1, wherein the processor is configured to:
store into the first memory an additional last value of the set of ordered first values, the additional last value being higher than any other value stored into the first memory; and
store into the second memory an additional last value of the set of ordered second values, the additional last value being equal to zero.

10. The circuit of claim 1, further comprising a third memory and a fourth memory, wherein the timer circuit further includes:
an edge detector circuit coupled to an input pin of the circuit, the input pin configured to receive an input PWM signal conveying an incoming CAN frame encoded according to a CAN protocol, the edge detector circuit configured to provide a first output signal indicative of falling edges detected in the input PWM signal and a second output signal indicative of rising edges detected in the input PWM signal;
a third register configured to capture a current count number of the counter circuit in response to a falling edge detected in the PWM signal; and
a fourth register configured to capture a current count number of the counter circuit in response to a rising edge detected in the PWM signal, wherein the counter circuit is configured to reset the internal count number in response to a falling edge detected in the input PWM signal.

11. The circuit of claim 10, wherein the circuit includes:
a third DMA controller configured to execute a DMA memory transfer of a current value stored into the third register to the third memory in response to a falling edge detected in the PWM signal and storing into the third memory a set of ordered third values indicative of the first parameter of the PWM periods in a respective sequence of ordered PWM periods of the input PWM signal, and
a fourth DMA controller configured to execute a DMA memory transfer of a current value stored into the fourth register to the fourth memory in response to a rising edge detected in the PWM signal and storing into the fourth memory a set of ordered fourth values indicative of the second parameter of the PWM periods in the respective sequence of ordered PWM periods of the input PWM signal, wherein the processor is configured to process the set of ordered third values and the set of ordered fourth values to generate an input sequence of binary values encoding the incoming CAN frame.

12. The circuit of claim 11, wherein processing the set of ordered third values and the set of ordered fourth values comprises:

reading a third value from the set of ordered third values and adding to the read third value a clock tolerance value to produce a corresponding adjusted third value;

dividing the adjusted third value by a time value indicative of an expected duration of a single bit transmitted by the incoming CAN frame to produce an integer value indicative of a total number of bits in a current PWM period;

reading a fourth value from the set of ordered fourth values corresponding to the read third value, and dividing the fourth value by the time value indicative of the duration of a single bit transmitted by the incoming CAN frame to produce an integer value indicative of a number of bits having a dominant state in the current PWM period;

subtracting the integer value indicative of a number of bits having a dominant state in the current PWM period from the integer value indicative of a total number of bits in a current PWM period to produce an integer value indicative of a number of bits having a recessive state in the current PWM period;

generating a sequence of bits comprising the number of bits having a dominant state and the number of bits having a recessive state; and repeating the reading the third value, dividing, reading the fourth value, subtracting, and generating until having processed a last third value stored in the third memory and a last fourth value stored in the fourth memory.

13. The circuit of claim 11, wherein the processor is configured to:

store the input sequence of binary values into a first buffer;

remove stuffing bits from the input sequence of binary values to generate a de-stuffed input sequence of binary values;

store the de-stuffed input sequence of binary values into a second buffer;

extract data conveyed by the incoming CAN frame from the de-stuffed input sequence of binary values stored into the second buffer; and check validity of a CRC code as a function of the input sequence of binary values stored into the first buffer.

14. The circuit of claim 11, wherein the timer circuit comprises a fifth register configured to:

compare the internal count number of the counter circuit to a threshold value stored into the fifth register; and issue an interrupt signal towards the processor in response to the internal count number of the counter circuit reaching the threshold value.

15. A device, comprising a circuit, the circuit comprising:
a first memory and a second memory;
a processor coupled to the first memory and the second memory, the processor configured to:
generate an output sequence comprising binary values encoding an outgoing Controller Area Network (CAN) frame according to a CAN protocol,
process the output sequence to detect a sequence of ordered pulse-width modulated (PWM) periods, each PWM period comprising a first portion having a dominant state and a second portion having a recessive state, each PWM period having a respective total duration and a respective duty-cycle value,
store a set of ordered first values indicative of a first parameter of the PWM periods in the sequence of ordered PWM periods and a last value of the set of ordered first values in the first memory, the last value being higher than any other value stored into the first memory, and
store a set of ordered second values indicative of a second parameter of the PWM periods in the sequence of ordered PWM periods and a last value of the set of ordered second values in the second memory, wherein the first parameter and the second parameter define a shape of the PWM periods, the last value being equal to zero; and a CAN transceiver couplable to a CAN bus, wherein an output pin of the circuit is configured to drive the CAN transceiver to transmit over the CAN bus outgoing CAN frames encoded according to a CAN protocol.

16. The device of claim 15, wherein the circuit further comprises a timer circuit comprising:

a first register configured to read from the first memory and store a value indicative of the first parameter of a current PWM period in the sequence of ordered PWM periods;

a counter circuit configured to:
increase an internal count number and reset the internal count number as a function of the value stored in the first register,
trigger reading from the first memory, and
trigger storing into the first register a subsequent value indicative of the first parameter of a subsequent PWM period in the sequence of ordered PWM periods as a function of the value stored in the first register; and a second register configured to:
read from the second memory and store a value indicative of the second parameter of the current PWM period,
compare the internal count number of the counter circuit to the value stored into the second register,
drive an output pin of the circuit to a dominant value or to a recessive value as a function of the comparing the internal count number of the counter circuit to the value stored into the second register, the output pin providing an output PWM signal comprising the sequence of ordered PWM periods,
read from the second memory, and
store a subsequent value indicative of the second parameter of a subsequent PWM period in the sequence of ordered PWM periods in response to the internal count number of the counter circuit reaching the value stored into the second register or in response to the internal count number of the counter circuit reaching the value stored into the first register.

17. The device of claim 16, wherein an input pin of the circuit is configured to receive from the CAN bus via the CAN transceiver incoming CAN frames encoded according to the CAN protocol.

18. The device of claim 16, wherein the first parameter of the PWM periods is the total duration of the PWM periods and the second parameter of the PWM periods is the duration of the first portions of the PWM periods.

19. A method, comprising:
generating an output sequence of binary values encoding an outgoing CAN frame according to a CAN protocol;
processing the output sequence of binary values to detect a sequence of ordered PWM periods, each PWM period comprising a first portion having a dominant state and a second portion having a recessive state, each PWM period having a respective total duration and a respective duty-cycle value;

storing into a first memory a set of ordered first values indicative of a first parameter of the PWM periods in the sequence of ordered PWM periods and a last value of the set of ordered first values, the last value being higher than any other value stored into the first memory;

storing into a second memory bank a set of ordered second values indicative of a second parameter of the PWM periods in the sequence of ordered PWM periods and a last value of the set of ordered second values, wherein the first parameter and the second parameter define a shape of the PWM periods, the last value being equal to zero;

reading from the first memory and storing into a first register a value indicative of the first parameter of a current PWM period in the sequence of ordered PWM periods;

increasing an internal count number of a counter circuit and resetting the internal count number of the counter circuit as a function of the value stored in the first register;

reading from the first memory and storing into the first register a subsequent value indicative of the first parameter of a subsequent PWM period in the sequence of ordered PWM periods as a function of the value stored in the first register;

reading from the second memory and storing into a second register a value indicative of the second parameter of the current PWM period;

comparing the internal count number of the counter circuit to the value stored into the second register;

driving an output pin to a dominant value or to a recessive value as a function of the comparing the internal count number of the counter circuit to the value stored into the second register, wherein the output pin provides an output PWM signal comprising the sequence of ordered PWM periods; and reading from the second memory and storing into the second register a subsequent value indicative of the second parameter of a subsequent PWM period in the sequence of ordered PWM periods in response to the internal count number of the counter circuit reaching the value stored into the second register or in response to the internal count number of the counter circuit reaching the value stored into the first register.

20. The method of claim 19, further comprising:

receiving, by an input pin of the circuit, an input PWM signal conveying an incoming CAN frame encoded according to a CAN protocol;

providing, by an edge detector circuit coupled to the input pin, a first output signal indicative of falling edges detected in the input PWM signal and a second output signal indicative of rising edges detected in the input PWM signal;

capturing, by a third register, a current count number of the counter circuit in response to a falling edge detected in the PWM signal;

capturing, by a fourth register, a current count number of the counter circuit in response to a rising edge detected in the PWM signal; and resetting, by the counter circuit, the internal count number in response to a falling edge detected in the input PWM signal.

* * * * *